United States Patent
Liao

(10) Patent No.: US 12,407,087 B2
(45) Date of Patent: Sep. 2, 2025

(54) SEMICONDUCTOR STRUCTURES AND METHOD OF FORMING THE SAME

(71) Applicant: Taiwan Semiconductor Manufacturing Company, Ltd., Hsinchu (TW)

(72) Inventor: Wen-Shiang Liao, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 959 days.

(21) Appl. No.: 17/361,269

(22) Filed: Jun. 28, 2021

(65) Prior Publication Data

US 2022/0328952 A1  Oct. 13, 2022

Related U.S. Application Data

(60) Provisional application No. 63/172,714, filed on Apr. 9, 2021.

(51) Int. Cl.
| | |
|---|---|
| *H01Q 1/22* | (2006.01) |
| *H01L 21/48* | (2006.01) |
| *H01L 23/498* | (2006.01) |
| *H01Q 1/48* | (2006.01) |
| *H01L 23/00* | (2006.01) |
| *H01L 25/065* | (2023.01) |

(52) U.S. Cl.
CPC ....... *H01Q 1/2283* (2013.01); *H01L 21/4857* (2013.01); *H01L 23/49816* (2013.01); *H01L 23/49822* (2013.01); *H01L 23/49827* (2013.01); *H01Q 1/48* (2013.01); *H01L 24/16* (2013.01); *H01L 25/0655* (2013.01); *H01L 2224/16227* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,740,079 B1 * | 8/2017 | Davids ............ G02B 6/1347 |
| 2014/0367867 A1 * | 12/2014 | Lin ................ H01L 24/19 257/777 |

(Continued)

*Primary Examiner* — Sue A Purvis
*Assistant Examiner* — Carnell Hunter, III
(74) *Attorney, Agent, or Firm* — JCIPRNET

(57) ABSTRACT

A semiconductor structure includes an antenna pad, a ground plane and a plurality of conductive vias. The ground plane is disposed over the antenna pad and includes a plurality of first conductive patterns separated from one another. The conductive vias are disposed between the antenna pad and the ground plane. The plurality of conductive vias are arranged to surround an area of the antenna pad and electrically connected to the antenna pad, and the plurality of first conductive patterns are overlapped with the area of the antenna pad.

20 Claims, 17 Drawing Sheets

(56) References Cited

U.S. PATENT DOCUMENTS

| | | | |
|---|---|---|---|
| 2019/0103680 A1* | 4/2019 | Liao | H01Q 21/065 |
| 2020/0105687 A1* | 4/2020 | Wang | H01L 23/66 |
| 2021/0118828 A1* | 4/2021 | Franson | H01Q 21/0087 |

* cited by examiner

SEMICONDUCTOR STRUCTURES AND METHOD OF FORMING THE SAME

CROSS-REFERENCE TO RELATED APPLICATION

This application claims the priority benefit of U.S. provisional application Ser. No. 63/172,714, filed on Apr. 9, 2021. The entirety of the above-mentioned patent application is hereby incorporated by reference herein and made a part of this specification.

BACKGROUND

In modern semiconductor devices and systems, integration and miniaturization of components have progressed at an increasingly rapid pace. In wireless applications, one of the growing challenges encountered by the integration process is the disposition of radio frequency devices or antennas. Antennas associated with integrated circuits are usually designed with limited performance and capability due to the competing objective of size reduction. Thus, an improved integrated antenna structure is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
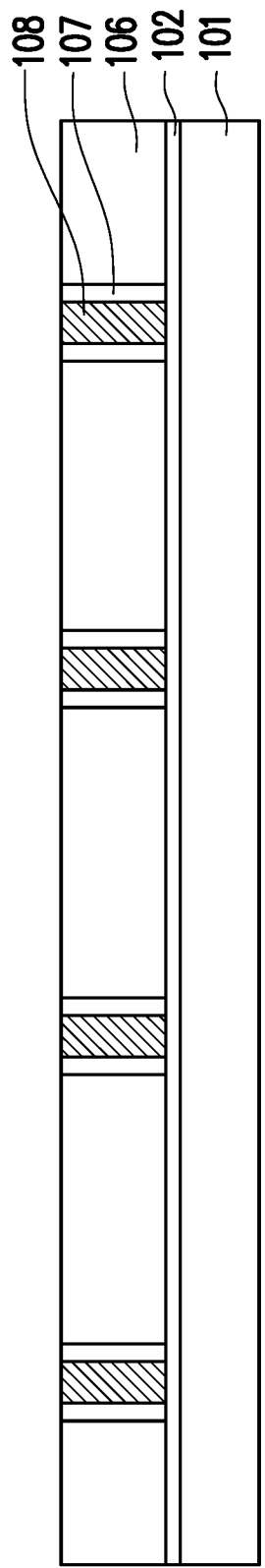
FIG. 1A to FIG. 1G illustrate schematic cross-sectional views of a method of forming semiconductor structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G illustrate schematic cross-sectional views of a method of forming semiconductor structure in accordance with some embodiments of the disclosure. It is understood that the disclosure is not limited by the method described below. Additional operations can be provided before, during, and/or after the method and some of the operations described below can be replaced or eliminated, for additional embodiments of the methods.

Although FIG. 1A to FIG. 1G are described in relation to a method, it is appreciated that the structures disclosed in FIG. 1A to FIG. 1G are not limited to such a method, but instead may stand alone as structures independent of the method.

Referring to FIG. 1A, a carrier 101 is provided, and an interposer 104 is formed on the carrier 101. The carrier 101 can be a blank glass carrier, a blank ceramic carrier, or the like. In some embodiments, a de-bonding layer 102 is formed between the interposer 104 and the carrier 101. The de-bonding layer 102 may be formed of an adhesive such as a ultra-violet (UV) glue, Light-to-Heat Conversion (LTHC) glue, or the like, although other types of adhesives may be used. In alternative embodiments, a buffer layer is formed between the de-bonding layer and the carrier 101. The buffer layer may include a dielectric material such as benzocyclobutene ("BCB"), polybenzoxazole ("PBO"), or any other suitable polymer-based dielectric material.

In some embodiments, the interposer 104 includes a substrate 106 and a plurality of through vias 108 in the substrate 106. The substrate 106 may be a semiconductor substrate and may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the through vias 108 penetrate through the substrate 106. For example, the through vias 108 extend from a first surface of the substrate 106 to a second surface opposite to the first surface of the substrate 106. In some embodiments, the through vias 108 are made of a conductive material. For example, the material of the through vias 108 includes aluminum, titanium, copper, nickel, tungsten, and/or alloys thereof. In some embodiments, a liner 107 is further formed between the through vias 108 and the substrate 106. In some embodiments, the liner 107 is made of a dielectric material such as silicon oxide. In some embodiments, the interposer 104 provides interconnection features for adjacent dies or devices. In that case, there may be no active or passive devices formed in the interposer 104.

Referring to FIG. 1B to FIG. 1E, a redistribution layer (RDL) structure 110 is formed over and electrically connected to the interposer 104, and an antenna cavity 135 is formed in the RDL structure 110.

Figure 1B:
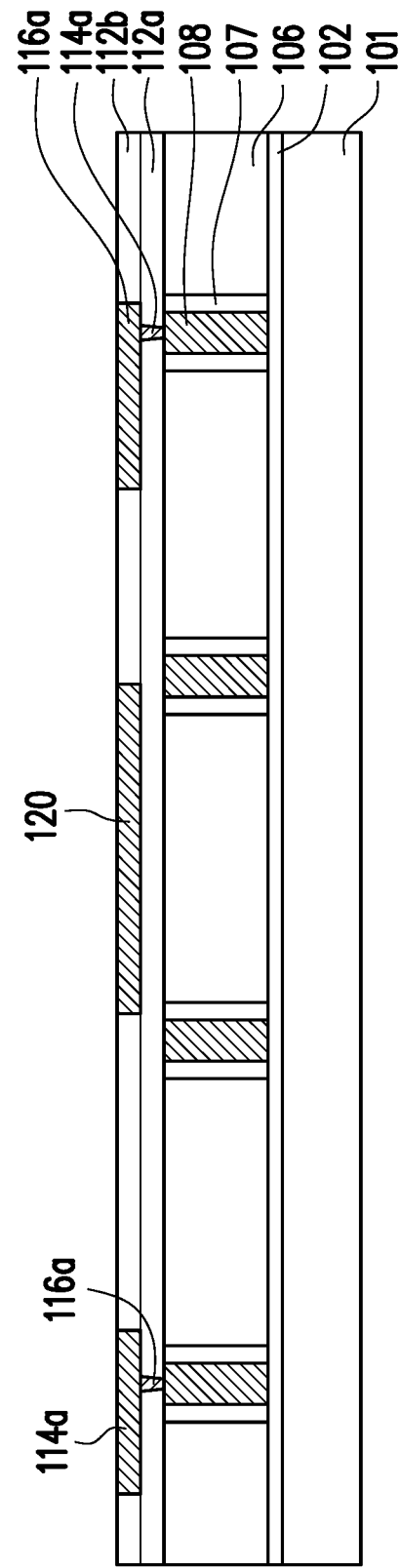

In some embodiments, as shown in FIG. 1B, a plurality of conductive vias 114a are formed over the through vias 108 to electrically connect the through vias 108. In some embodiments, a dielectric layer 112a is formed on the top surface of the interposer 104, and the conductive vias 114a are formed in the dielectric layer 112a. In some embodiments, the dielectric layer 112a includes silicon oxide, silicon nitride or a silicon oxynitride. In alternative embodiments, the dielectric layer 112a includes a low-k dielectric material having a dielectric constant (k) less than 4. The low-k dielectric material has a dielectric constant from about 1.2 to about 3.5. In alternative embodiments, the dielectric layer 112a includes TEOS formed oxide, undoped silicate glass, or doped silicate glass such as BPSG, FSG, PSG, BSG, and/or other suitable dielectric materials. In some embodiments, the dielectric layer 112a is deposited by CVD, PECVD, PVD, spin coating, the like, or a combination thereof. Then, the dielectric layer 112a is patterned to form a plurality of openings. For example, the dielectric layer 112a is patterned utilizing a combination of photolithography and etching techniques to form openings corresponding to the desired pattern of the conductive vias 114a. After that, the openings are filled with a conductive material to form the conductive vias 114a. In some embodiments, a seed layer is deposited on surfaces of the openings, and then a conductive material fills the openings by electroplating. Suitable materials for the seed layer include copper, copper alloy, or the like, and suitable materials for the conductive material include copper, silver, gold, tungsten, aluminum, combinations thereof, or the like. A chemical mechanical planarization (CMP) process or the like may be used to remove excess seed layer and/or conductive material from a surface of the dielectric layer 112a and to planarize surfaces of the dielectric layer 112a and the conductive vias 114a for subsequent processing.

Then, an antenna pad 120 is formed over the interposer 104. In some embodiments, the antenna pad 120 is formed in a dielectric layer 112b over the dielectric layer 112a. The antenna pad 120 may be electrically isolated from the interposer 104 through the dielectric layer 112a. The material and forming method of the dielectric layer 112b may be similar to or the same as those described above with respect to the dielectric layer 112a. For example, the dielectric layer 112b includes silicon oxide.

In some embodiments, a plurality of conductive lines 116a are formed in the dielectric layer 112a aside the antenna pad 120. The conductive lines 116a are electrically connected to the through vias 108 by the conductive vias 114a therebetween. The conductive lines 116a may be also referred to as a first-level conductive line of the RDL structure 110. In some embodiments, the antenna pad 120 is disposed adjacent to the conductive lines 116a and embedded in the first-level conductive lines of the RDL structure 110. The antenna pad 120 may be simultaneously formed with the first-level conductive line of the RDL structure 110 by the same process. For example, the dielectric layer 112b is patterned utilizing a combination of photolithography and etching techniques to form trenches corresponding to the desired pattern of the antenna pad 120 and the conductive lines 116a. After that, the trenches are filled with a conductive material to form the antenna pad 120 and the conductive lines 116a. In some embodiments, a seed layer is deposited on surfaces of the trenches, and then a conductive material fills the trenches by electroplating. Suitable materials for the seed layer include copper, copper alloy, or the like, and suitable materials for the conductive material include copper, silver, gold, tungsten, aluminum, combinations thereof, or the like. A chemical mechanical planarization (CMP) process or the like may be used to remove excess seed layer and/or conductive material from a surface of the dielectric layer 112b and to planarize surfaces of the dielectric layer 112b, the antenna pad 120 and the conductive lines 116a for subsequent processing. In some embodiments, top and bottom surfaces of the antenna pad 120 are substantially coplanar with top and bottom surfaces of the conductive lines 116a respectively. The material of the antenna pad 120 is substantially the same as the material of the conductive lines 116a, for example. In alternative embodiments, the antenna pad 120 and the conductive lines 116a are formed separately. In such embodiments, the material of the antenna pad 120 is substantially the same as or different from the material of the conductive lines 116a. In some embodiments, one antenna pad 120 is illustrated for clarify, however, there may be a plurality of antenna pads. In some embodiments, the conductive vias 114a and the conductive lines 116a are separately formed and disposed in different dielectric layers respectively. However, the disclosure is not limited thereto. The conductive vias 114a and the conductive lines 116a may be formed simultaneously by a dual-damascene process, and the conductive vias 114a and the conductive lines 116a may be formed in the same dielectric layer. In such embodiments, one of the dielectric layers 112a and 112b is omitted.

Figure 2:
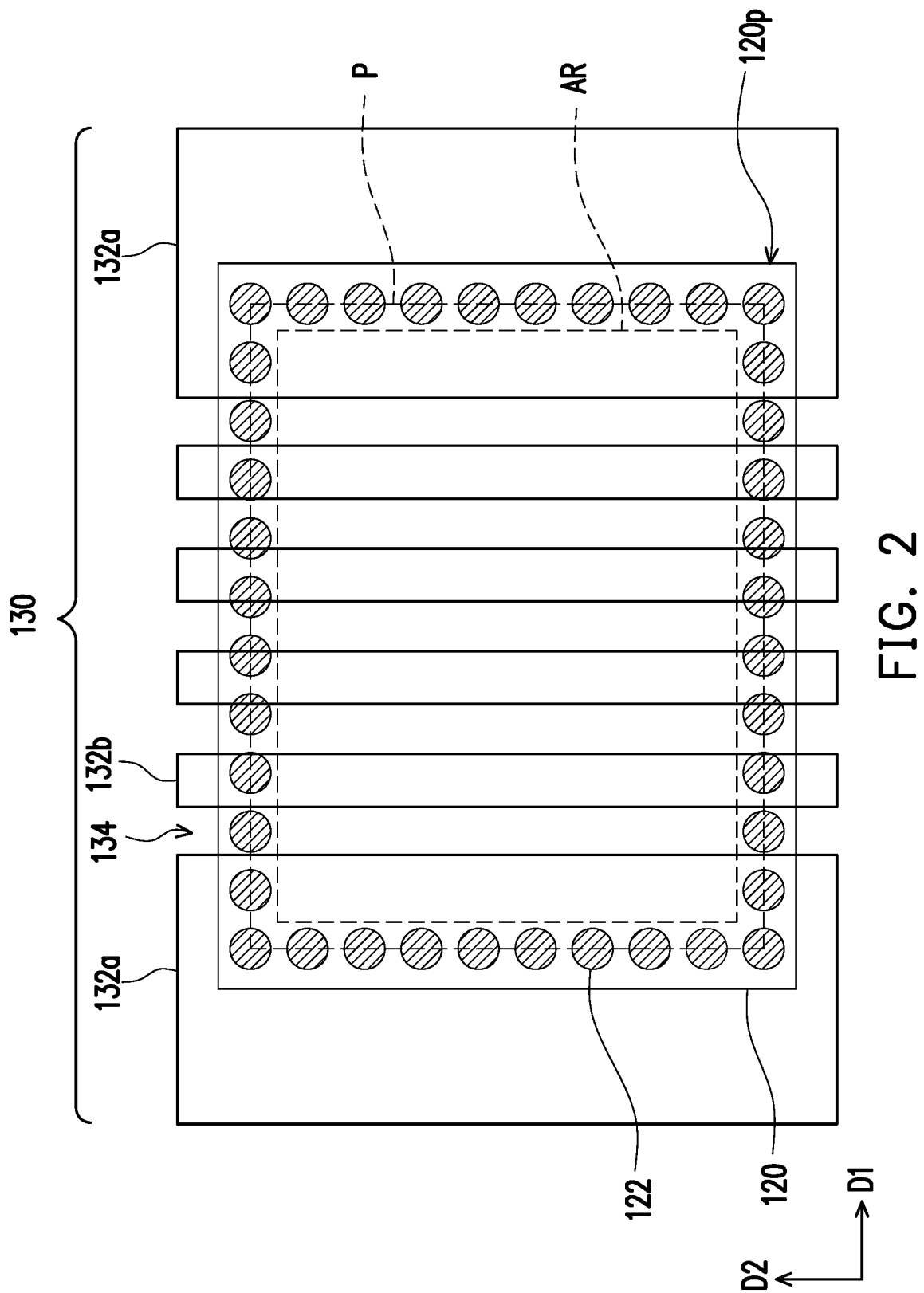
FIG. 2 illustrates a schematic top view of a semiconductor structure of FIG. 1G in accordance with some embodiments of the disclosure.

As shown in FIG. 2, from a top view, the antenna pad 120 may be rectangular shaped. The antenna pad 120 has a first dimension (e.g., length) in a first direction D1 and a second dimension (e.g., width) in a second direction D2 perpendicular to the first direction D1. In some embodiments, the first direction D1 and the second direction D2 are both perpendicular to a stacking direction of the interposer 104 and the antenna pad 120. The first dimension and/or the second dimension of the antenna pad 120 may range from 0.4 mm to about 4.5 mm. The interposer 104 has a first dimension (e.g., length) in the first direction D1 and a second dimension (e.g., width) in the second direction D2.

The first dimension and/or the second dimension of the interposer 104 may range from about 0.5 mm to about 10 mm.

Figure 1C:
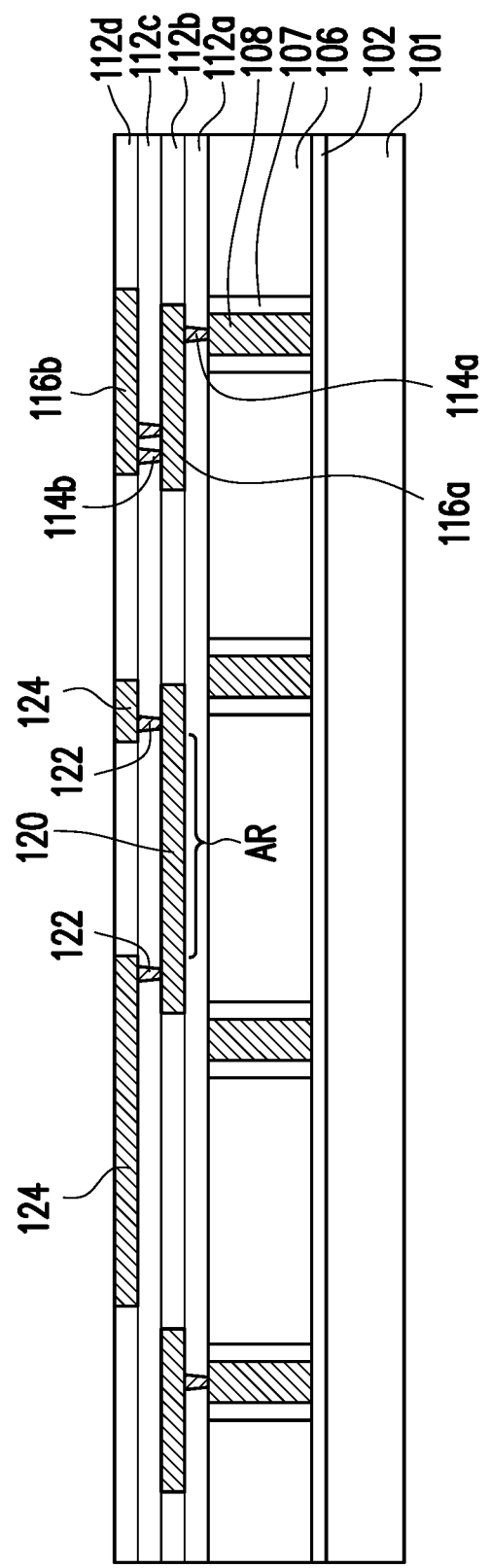

Referring to FIG. 1C, a plurality of conductive patterns 122 is formed over the antenna pad 120, and a plurality of conductive vias 114b are formed over the conductive lines 116a. In some embodiments, the conductive patterns 122 and the conductive vias 114b are formed in a dielectric layer 112c over the dielectric layer 112b. The material and forming method of the dielectric layer 112c may be similar to or the same as those described above with respect to the dielectric layer 112a. For example, the dielectric layer 112c includes silicon oxide.

In some embodiments, the conductive patterns 122 are conductive vias. The conductive patterns 122 may be directly formed on the antenna pad 120. For example, the conductive patterns 122 are in direct contact with the antenna pad 120 and electrically connected to the antenna pad 120. In some embodiments, as shown in FIG. 2, the conductive patterns 122 are disposed along a periphery 120p of the antenna pad 120 to surround an area AR of the antenna pad 120. For example, the conductive patterns 122 are arranged along a ring-shaped path P surrounding the area AR. In some embodiments, the conductive patterns 122 are arranged regularly, that is, a distance between the adjacent conductive patterns 122 is constant. In alternative embodiments, the conductive patterns 122 are arranged irregularly or randomly, that is, a distance between the conductive patterns 122 is not constant. In some embodiments, the ring-shaped path P is rectangular, for example. However, the ring-shaped path P may be designed as other suitable ring shape such as circle, square or polygon depending on the shape of the semiconductor die and/or requirements. In some embodiments, the conductive patterns 122 are substantially of the same diameter. However, the disclosure is not limited thereto. In alternative embodiments, the conductive patterns 122 have different diameter. In some embodiments, the diameter of the conductive patterns 122 ranges from about 0.1 μm to about 100 μm. In some embodiments, the diameter of the conductive patterns 122 are substantially the same as or different from the diameter of the conductive vias 114b.

In some embodiments, the conductive patterns 122 include a conductive material such as copper, silver, gold, tungsten, aluminum, combinations thereof, or the like. In an embodiment, the conductive patterns 122 further include a seed layer of copper or copper alloy. In some embodiments, the conductive vias 114b are electrically connected to the conductive lines 116a. For example, the conductive vias 114b are in direct contact with the conductive lines 116a therebeneath. The conductive vias 114b may have the same material as the conductive patterns 122 and may be formed simultaneously with the conductive patterns 122. For example, the dielectric layer 112c is patterned utilizing a combination of photolithography and etching techniques to form openings corresponding to the desired pattern of the conductive patterns 122 and the conductive vias 114b. After that, the openings are filled with a conductive material to form the conductive patterns 122 and the conductive vias 114b. In some embodiments, a seed layer is deposited on surfaces of the openings, and then a conductive material fills the openings by electroplating. A chemical mechanical planarization (CMP) process or the like may be used to remove excess seed layer and/or conductive material from a surface of the dielectric layer 112c and to planarize surfaces of the dielectric layer 112c, the conductive patterns 122 and the conductive vias 114b for subsequent processing. In some embodiments, the antenna pad 120 and the conductive patterns 122 are disposed in different dielectric layers 112b and 112c. Similarly, the conductive vias 114b and the conductive lines 116a are disposed in different dielectric layers 112b and 112c. However, the disclosure is not limited thereto. In alternative embodiments, the antenna pad 120 and the conductive patterns 122 thereover and the conductive lines 116a and the conductive vias 114b thereover are disposed in the same dielectric layer. For example, the antenna pad 120 and the conductive lines 116a are formed by forming a conductive layer over the dielectric layer 112b and patterning the conductive layer. In such embodiments, a dielectric layer is then formed to cover the top surfaces of the antenna pad 120 and the conductive lines 116a. After that, the conductive patterns 122 and the conductive vias 114b are formed in the dielectric layer by patterning the dielectric layer to form a plurality of openings exposing the antenna pad 120 and the conductive lines 116a and filling a conductive material in the openings, for example. In such embodiments, one of the dielectric layers 112b and 112c is omitted.

Then, a plurality of conductive patterns 124 are formed over the conductive patterns 122, and a plurality of conductive lines 116b are formed over the conductive vias 114b, for example. In some embodiments, the conductive patterns 124 and the conductive lines 116b are formed in a dielectric layer 112d over the dielectric layer 112c. The material and forming method of the dielectric layer 112d may be similar to or the same as those described above with respect to the dielectric layer 112a. For example, the dielectric layer 112d includes silicon oxide.

The conductive patterns 124 are electrically connected to the conductive patterns 122. The conductive patterns 124 may be disposed at different sides (e.g., first to fourth) of the antenna pad 120, to cover and electrically connect the conductive patterns 122 at the respective side of the antenna pad 120. For example, the conductive pattern 124 disposed at the first side of the antenna pad 120 covers and electrically connects the conductive patterns 122 at the first side of the antenna pad 120, and the conductive pattern 124 disposed at the second side of the antenna pad 120 covers and electrically connects the conductive patterns 122 at the second side of the antenna pad 120. The conductive pattern 124 may be a plate, a strip or any other suitable shape. However, the disclosure is not limited thereto. In alternative embodiments, more than one conductive pattern 124 electrically connects the conductive patterns 122 disposed at the same side of the antenna pad 120. In alternative embodiments, one conductive pattern 124 electrically connects the conductive patterns 122 disposed at different sides of the antenna pad 120.

In some embodiments, the conductive lines 116b are electrically connected to the conductive lines 116a by the conductive vias 114b therebetween. The conductive lines 116b may be also referred to as a second-level conductive line of the RDL structure 110. In some embodiments, the conductive patterns 124 are disposed adjacent to the conductive lines 116b and embedded in the second-level conductive lines of the RDL structure 110. The conductive patterns 124 may be simultaneously formed with the second-level conductive line of the RDL structure 110 by the same process. For example, the dielectric layer 112d is patterned utilizing a combination of photolithography and etching techniques to form openings corresponding to the desired pattern of the conductive patterns 124 and the conductive lines 116b. After that, the openings are filled with a conductive material to form the conductive patterns 124 and the conductive lines 116b. In some embodiments, a seed layer is deposited on surfaces of the openings, and then a conductive material fills the openings by electroplating. Suitable materials for the seed layer include copper, copper alloy, or the like, and suitable materials for the conductive material include copper, silver, gold, tungsten, aluminum, combinations thereof, or the like. A chemical mechanical planarization (CMP) process or the like may be used to remove excess seed layer and/or conductive material from a surface of the dielectric layer 112d and to planarize surfaces of the dielectric layer 112d, the conductive patterns 124 and the conductive lines 116b for subsequent processing. In some embodiments, the material of the conductive patterns 124 is substantially the same as the conductive lines 116b. Top and bottom surfaces of the conductive patterns 124 may be substantially coplanar with top and bottom surfaces of the conductive lines 116b respectively. In alternative embodiments, the conductive patterns 124 and the conductive lines 116b are formed separately. In such embodiments, the material of the antenna pad 120 is substantially the same as or different from the material of the conductive lines 116a. In some embodiments, the conductive vias 114b and the conductive lines 116b are separately formed and disposed in different dielectric layers respectively. However, the disclosure is not limited thereto. The conductive vias 114b and the conductive lines 116b may be formed simultaneously by a dual-damascene process, and the conductive vias 114b and the conductive lines 116b may be formed in the same dielectric layer. In such embodiments, one of the dielectric layers 112c and 112d is omitted.

Figure 1D:
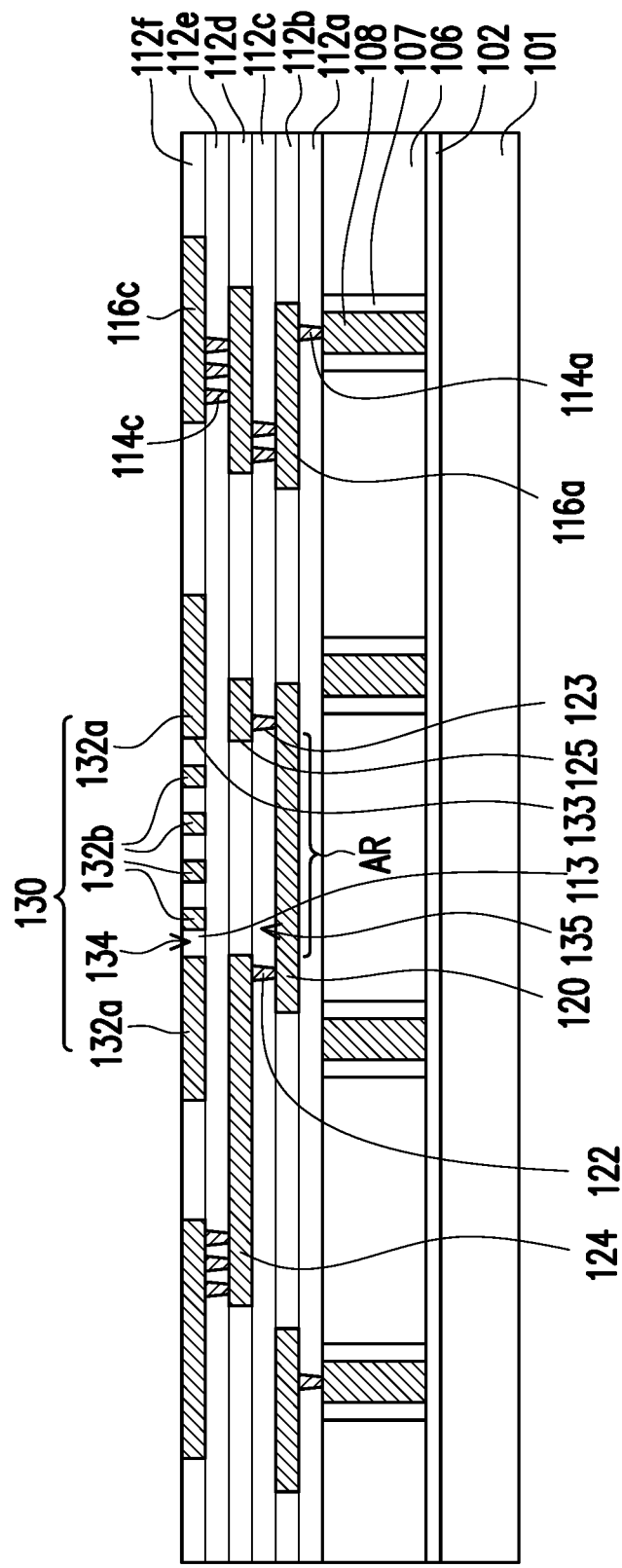

Referring to FIG. 1D, a ground plane 130 is formed over the antenna pad 120, and a plurality of conductive lines 116c are formed over the conductive lines 116b. In some embodiments, before forming the ground plane 130 and conductive lines 116c, a plurality of conductive vias 114c in a dielectric layer 112e are formed between the conductive lines 116b and the conductive lines 116c, so as to electrically connect the conductive lines 116b and the conductive lines 116c. In some embodiments, the ground plane 130 and the conductive lines 116c are formed in a dielectric layer 112f over the dielectric layer 112e. The material and forming method of the dielectric layers 112e and 112f may be similar to or the same as those described above with respect to the dielectric layer 112a. For example, the dielectric layers 112e and 112f includes silicon oxide.

The ground plane 130 includes a plurality of conductive patterns 132a, 132b over the antenna pad 120. The conductive patterns 132b (i.e., inner conductive patterns) are disposed between the conductive patterns 132a (i.e., outer conductive patterns). In some embodiments, the conductive patterns 132a, 132b are separated from one another, and a plurality of slits 134 are formed between the adjacent conductive patterns 132a, 132b. The slits 134 may be also referred to as space or spacing. The conductive patterns 132a, 132b are grounded, for example. In some embodiments, the ground plane 130 is also referred to as a grated grounding element. The ground plane 130 is electrically isolated from the conductive patterns 122, the conductive patterns 124 and the conductive lines 116c, for example. In some embodiments, the conductive patterns 132a, 132b are respectively extended along a direction (e.g., the second direction D2), and the conductive patterns 132a, 132b are arranged along a direction substantially perpendicular to the direction (e.g., the first direction D1). The conductive patterns 132a, 132b may be substantially parallel to each other, for example. In some embodiments, the silts 134 are filled with the dielectric layer 112f. For example, the dielectric layer 112f includes a plurality of dielectric patterns 113 filling the silts 134 respectively. In some embodiments, a dimension in the first direction D1 (e.g., a width) of the slits 134 is constant. The dimension in the first direction D1 of the slits 134 ranges from about 0.1 µm to about 1000 µm, for example. However, the disclosure is not limited thereto. The slits 134 may have different width. In alternative embodiments, the conductive patterns 132a, 132b are physically connected at their ends. For example, the ground plane 130 further includes a connection pattern (not shown), and the connecting pattern physically connects ends of the conductive patterns 132a, 132b. An extending direction of the connecting pattern may be substantially perpendicular to an extending direction of the conductive patterns 132a, 132b. In such embodiments, the ground plane 130 is comb-shaped.

In some embodiments, the ground plane 130 including the conductive patterns 132a, 132b and the slits 134 at least covers the area AR of the antenna pad 120 surrounded by the conductive patterns 122. For example, as shown in FIG. 1D and FIG. 2, a projection of the ground plane 130 including the conductive patterns 132a, 132b and the slits 134 onto the top surface of the interposer 104 is larger than and overlapped with a projection of the area AR of the antenna pad 120 onto the top surface of the interposer 104. In some embodiments, the ground plane 130 including the conductive patterns 132a, 132b and the slits 134 fully covers the antenna pad 120 therebelow. Each of the conductive patterns 132a, 132b and the slits 134 is overlapped with the antenna pad 120, for example.

In some embodiments, as shown in FIG. 1D, in a stacking direction of the antenna pad 120, the conductive patterns 122, the conductive patterns 124 and the ground plane 130, the slits 134 are not overlapped with any conductive element between the ground plane 130 and the antenna pad 120. For example, as shown in FIG. 1D and FIG. 2, a projection of the silts 134 onto the antenna pad 120 is not overlapped with a projection of the conductive patterns 124 onto the antenna pad 120. Similarly, a projection of the silts 134 onto the antenna pad 120 is not overlapped with a projection of the conductive patterns 122 onto the antenna pad 120. In some embodiments, the conductive patterns 124 and the conductive patterns 122 are substantially not overlapped with the area AR of the antenna pad 120. In some embodiments, as shown in FIG. 1D, an inner sidewall 125 of the conductive pattern 124 is substantially flush with an inner sidewall 133 of the outermost conductive pattern 132a. However, the disclosure is not limited thereto. In alternative embodiments, the inner sidewall 125 of the conductive pattern 124 is disposed between the inner sidewall 133 of the outermost conductive pattern 132a and an inner sidewall of the conductive patterns 122. In some embodiments, an antenna cavity 135 is formed between the antenna pad 120, the ground plane 130 and the inner sidewalls 123, 125 of the conductive patterns 122, 124. For example, the antenna cavity 135 is formed between the area AR of the antenna pad 120, the ground plane 130 and the inner sidewalls 123, 125 of the conductive patterns 122, 124. In some embodiments, the inner sidewalls 123, 125 of the conductive patterns 122, 124 cooperatively form a surrounding sidewall for the antenna cavity 135. The surrounding sidewall of the antenna cavity 135 may be discrete or continuous. The antenna cavity 135 is a resonant cavity that allows for electromagnetic waves to radiate to or from the antenna pad 120. In some embodiments, the antenna cavity 135 is also referred to as an oscillation cavity. The antenna cavity 135 may be filled with a dielectric material. In some embodiments, the antenna cavity 135 is filled with a dielectric material of at least one dielectric layer of the RDL structure 110. For example, the antenna cavity 135 is filled with the dielectric materials of the dielectric layers 112c, 112d and 112e of the RDL structure 110. In some embodiments, the dielectric materials of the dielectric layers 112c, 112d and 112e of the RDL structure 110 are the same. For example, the dielectric materials of the dielectric layers 112c, 112d and 112e of the RDL structure 110 are silicon oxide. However, the disclosure is not limited thereto. In alternative embodiments, the dielectric materials filling the antenna cavity 135 are different.

The conductive lines 116c may be also referred to as a third-level conductive line of the RDL structure 110. In some embodiments, the conductive patterns 132a, 132b of the ground plane 130 are disposed adjacent to the conductive lines 116c and embedded in the third-level conductive lines of the RDL structure 110. The ground plane 130 may be simultaneously formed with the third-level conductive line of the RDL structure 110 by the same process. For example, the dielectric layer 112f is patterned utilizing a combination of photolithography and etching techniques to form openings corresponding to the desired pattern of the conductive patterns 132a, 132b and the conductive lines 116c. After that, the openings are filled with a conductive material to form the conductive patterns 132a, 132b and the conductive lines 116c. In some embodiments, a seed layer is deposited on surfaces of the openings, and then a conductive material fills the openings by electroplating. Suitable materials for the seed layer include copper, copper alloy, or the like, and suitable materials for the conductive material include copper, silver, gold, tungsten, aluminum, combinations thereof, or the like. A chemical mechanical planarization (CMP) process or the like may be used to remove excess seed layer and/or conductive material from a surface of the dielectric layer 112f and to planarize surfaces of the dielectric layer 112f, the conductive patterns 132a, 132b and the conductive lines 116c for subsequent processing. In alternative embodiments, the ground plane 130 and the conductive lines 116c are formed separately. In some embodiments, the conductive vias 114c and the conductive lines 116c are separately formed and disposed in different dielectric layers respectively. However, the disclosure is not limited thereto. The conductive vias 114c and the conductive lines 116c may be formed simultaneously by a dual-damascene process, and the conductive vias 114c and the conductive lines 116c may be formed in the same dielectric layer. In such embodiments, one of the dielectric layers 112e and 112f is omitted.

In some embodiments, the material of the conductive patterns 132a, 132b is substantially the same as the conductive lines 116c. However, the disclosure is not limited thereto. In alternative embodiments, the material of the conductive patterns 132a, 132b is different from the conductive lines 116c. In some embodiments, top and bottom surfaces of the conductive patterns 132a, 132b are be substantially coplanar with top and bottom surfaces of the conductive lines 116c respectively.

Figure 1E:
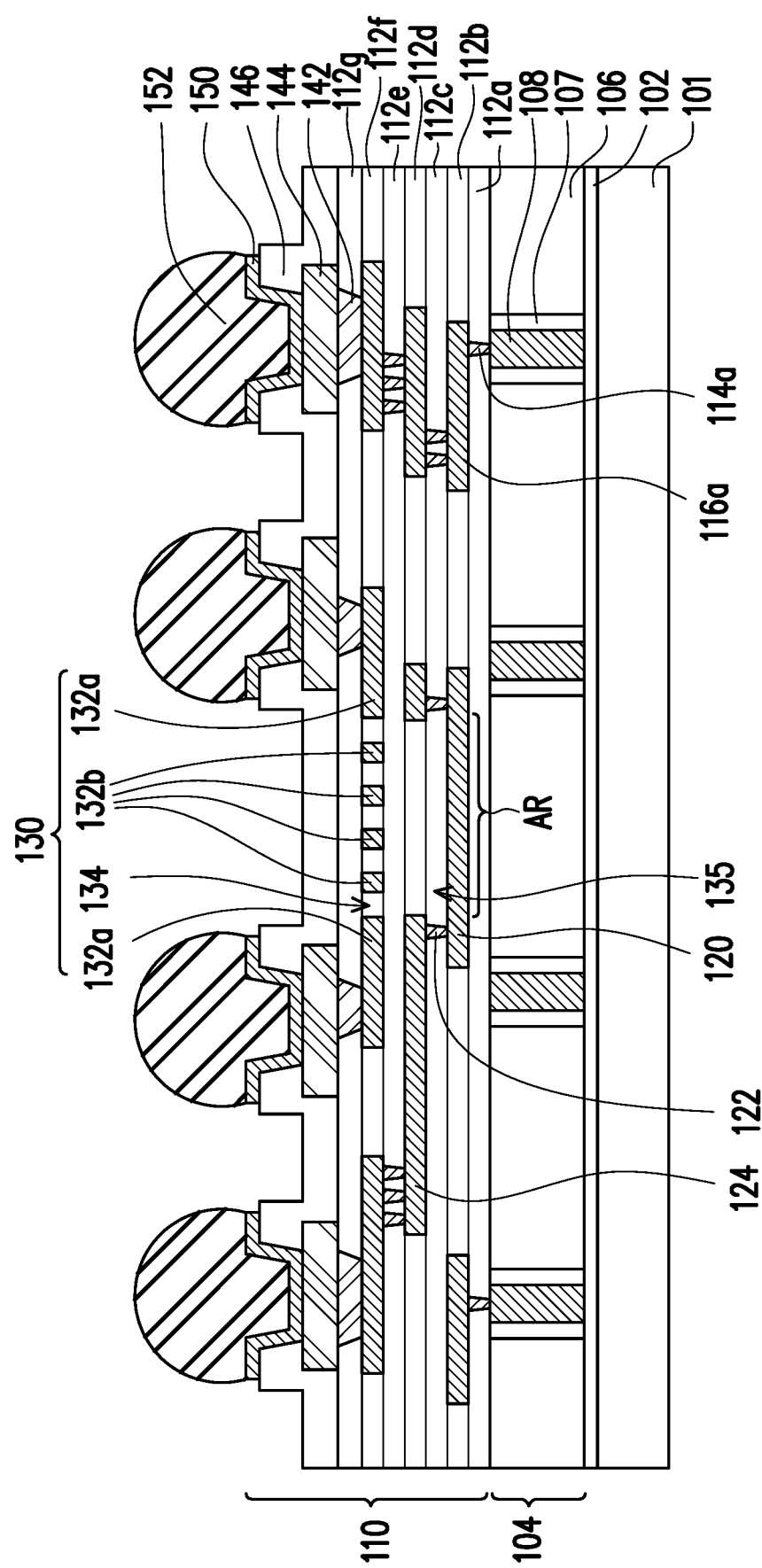

Referring to FIG. 1E, after forming the ground plane 130, a plurality of conductive vias 142 and a plurality of conductive patterns 144 are formed over the ground plane 130. In some embodiments, the conductive vias 142 are disposed in a dielectric layer 112g over the dielectric layer 112f, and the conductive patterns 144 are disposed in a dielectric layer 112h over the dielectric layer 112g. However, the disclosure is not limited thereto. The conductive vias 142 and the conductive patterns 144 may be formed in the same dielectric layer and formed by the same process. In some embodiments, the conductive vias 142 and the conductive patterns 144 include a conductive material such as copper, silver, gold, tungsten, aluminum, combinations thereof, or the like. In an embodiment, the conductive vias 142 are aluminum vias, and the conductive patterns 144 are aluminum pads.

Then, in some embodiments, a passivation layer 146 is formed to cover the conductive patterns 144, and the conductive patterns 150 are formed in the passivation layer 146 to electrically connect the conductive patterns 144. The conductive patterns 150 may be under-bump metallurgy (UBM) patterns. After forming the conductive patterns 150, a plurality of electrical connectors 152 are formed on the conductive patterns 150 respectively, to electrically connect the conductive patterns 144 therebelow. In some embodiments, the electrical connectors 152 are micro-bumps, solder balls such as a ball grid array (BGA), metal pillars, electroless nickel-electroless palladium-immersion gold technique (ENEPIG) formed bumps, or the like. In such embodiments, the bump electrical connectors 152 include a conductive material such as solder, copper, aluminum, gold, nickel, silver, palladium, tin, the like, or a combination thereof. In an embodiment, the electrical connectors 152 are formed by initially forming a layer of solder through suitable methods such as evaporation, electroplating, printing, solder transfer, ball placement, or the like. Once the layer of solder has been formed on the structure, a reflow may be performed in order to shape the material into the desired bump shapes.

Figure 1F:
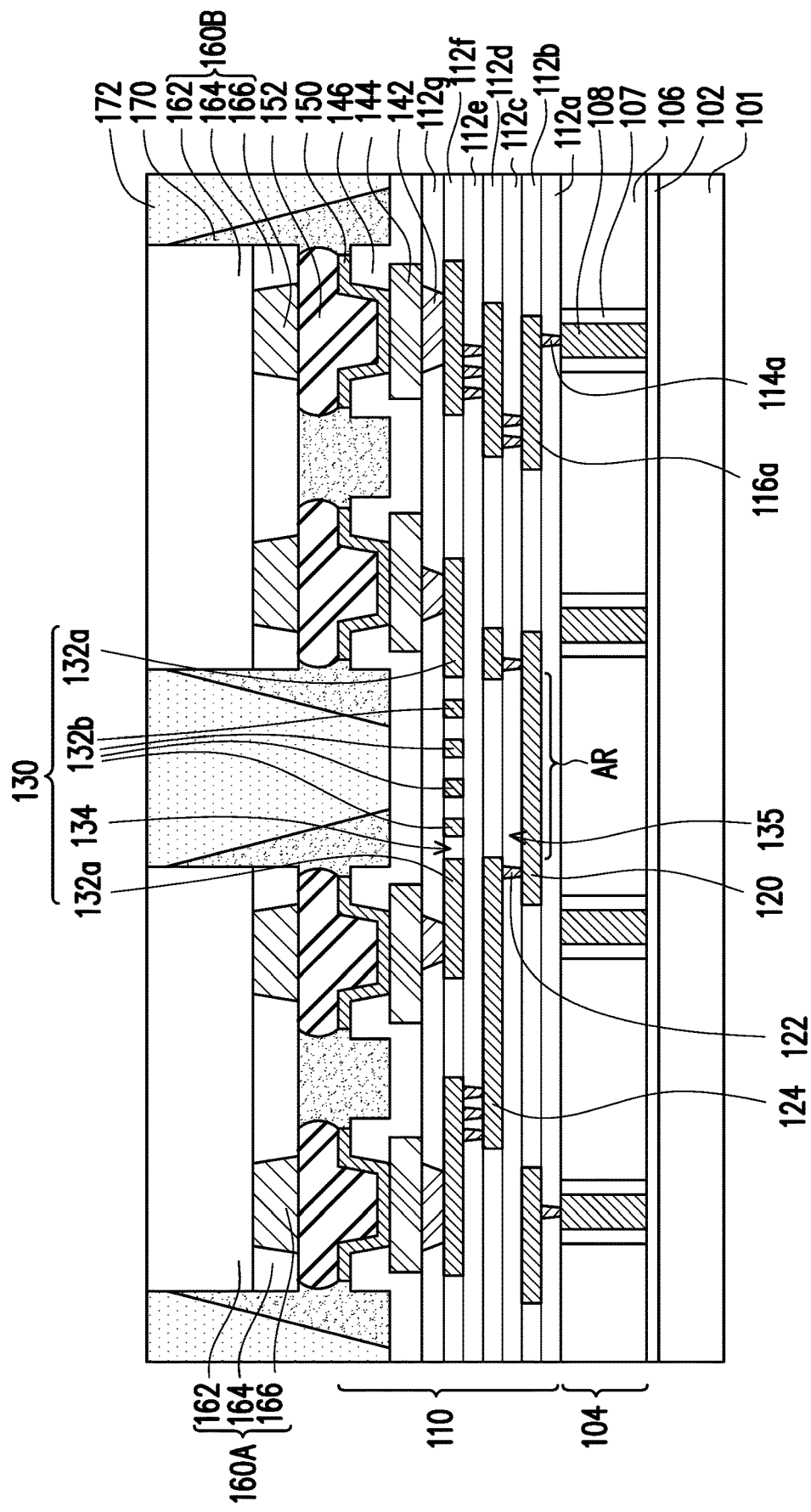

Referring to FIG. 1F, a plurality of dies 160A, 160B are formed over the RDL structure 110 through the electrical connectors 152. The dies 160A, 160B may each include a semiconductor substrate 162, a protection layer 164 over the semiconductor substrate 162 and conductive connectors 166 in the protection layer 164. The semiconductor substrate 162 may be a semiconductor substrate and may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, a material of the protection layer 164 includes polybenzoxazole, polyimide, a suitable organic or inorganic material, or the like. In some embodiments, the conductive connectors 166 include conductive vias, vias, bumps and/or posts made of solder, gold, copper, or any other suitable conductive materials. In some embodiments, the conductive connectors 166 of the dies 160A, 160B are bonded to the electrical connectors 152 respectively. The dies 160A, 160B may include a variety of electrical circuits suitable for a particular application. The electrical circuits may include various devices such as transistors, capacitors, resistors, diodes or the like. In some embodiments, the electrical circuits include transistors electrically connected to the antenna pad 120 and used for configuring the transmission and reception of the electromagnetic signal. In some embodiments, the die 160A, 160B is a die, a chip or a package. In some embodiments, the die 160A, 160B is a logic device die, a central processing unit (CPU) die, a graphics processing unit (GPU) die, a mobile phone application processing (AP) die, a system on chip (SoC) that integrates multiple electronic components into a single die, or a high bandwidth memory (HBM) die. The die 160B may be operable in pairs with the die 160A. In some embodiments, the die 160A is a RF controller die (e.g., RF transceiver die), and the die 160B is a baseband die. In some embodiments, the RF transceiver die includes a transmitter circuit configured to generate an electrical signal and a receiving circuit configured to receive the electrical signal.

Then, an underfill 170 may be formed between the dies 160A, 160B and the RDL structure 110 to surround the conductive connectors 166 of the dies 160A, 160B. The underfill 170 may be formed by a capillary flow process after the dies 160A, 160B are attached, or may be formed by a suitable deposition method before the dies 160A, 160B are attached.

After forming the underfill 170, an encapsulant 172 is formed over the dies 160A, 160B and the underfill 170. The encapsulant 172 may be a molding compound, epoxy, or the like, and may be applied by compression molding, transfer molding, or the like. The encapsulant 172 may be formed over the redistribution structure 110 such that the dies 160A, 160B are buried or covered. The encapsulant 172 is then cured.

Figure 1G:
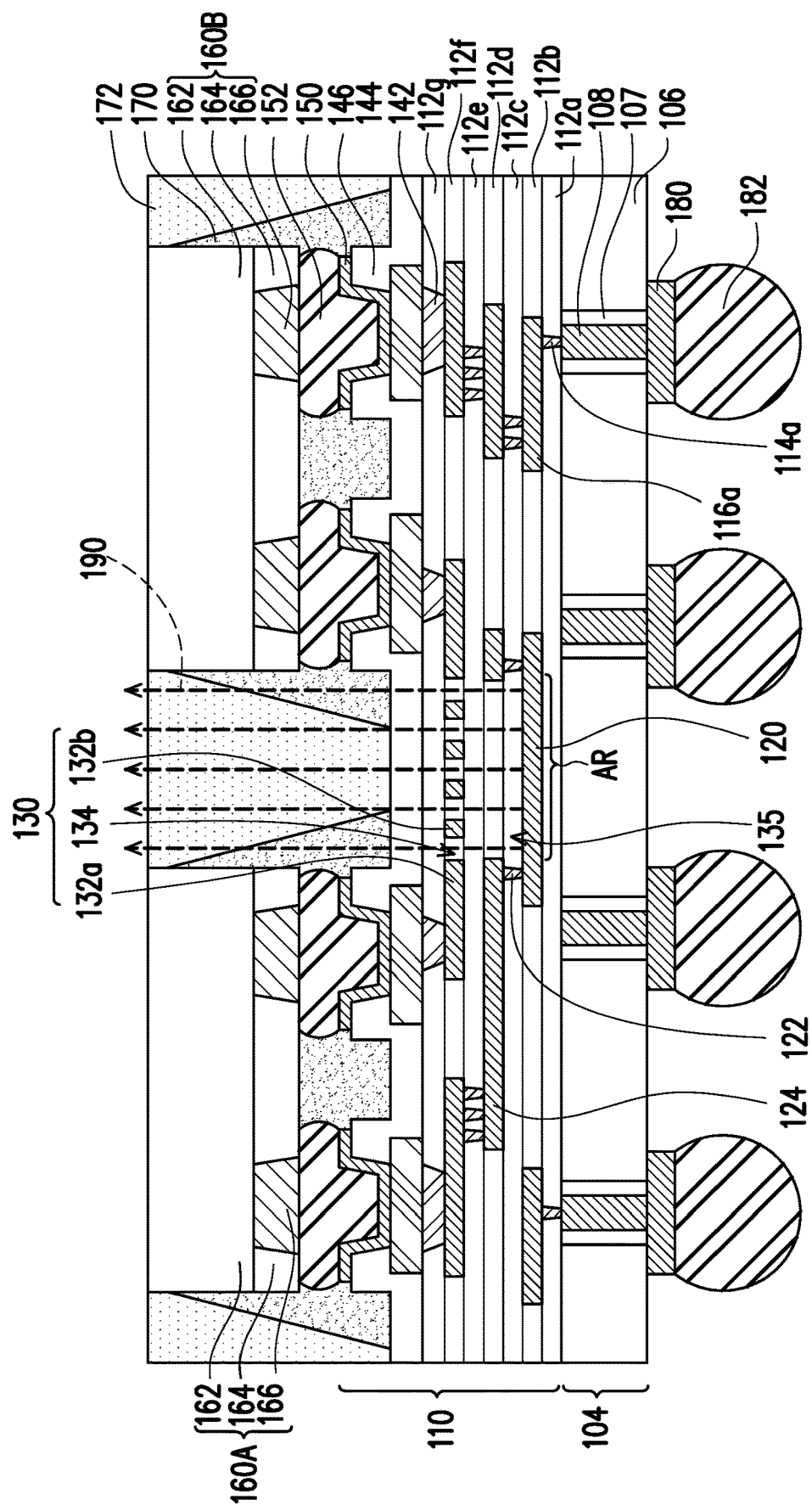

Referring to FIG. 1G, the carrier 101 is de-bonded and is separated from the interposer 104. In some embodiments, the de-bonding process includes projecting a light such as a laser light or an UV light on the de-bonding layer 102 (e.g., the LTHC release layer), so that the carrier 101 can be easily removed along with the de-bonding layer 102. During the de-bonding step, a tape (not shown) may be used to secure the structure before de-bonding the carrier 101 and the de-bonding layer 102. After removing the carrier 101 and the de-bonding layer 102, a plurality of conductive patterns 180 such as UBM patterns are formed on the through vias 108 respectively. After forming the conductive patterns 180, a plurality of electrical connectors 182 are formed on the conductive patterns 180 respectively, to electrically connect the conductive patterns 180 therebelow. In some embodiments, the electrical connectors 182 are controlled collapse chip connection (C4) bumps, solder balls such as a ball grid array (BGA), metal pillars, electroless nickel-electroless palladium-immersion gold technique (ENEPIG) formed bumps, or the like. In such embodiments, the bump electrical connectors 182 include a conductive material such as solder, copper, aluminum, gold, nickel, silver, palladium, tin, the like, or a combination thereof. In an embodiment, the electrical connectors 182 are formed by initially forming a layer of solder through suitable methods such as evaporation, electroplating, printing, solder transfer, ball placement, or the like. Once the layer of solder has been formed on the structure, a reflow may be performed in order to shape the material into the desired bump shapes. The removal of the carrier 101 and the de-bonding layer 102 and/or formation of the conductive patterns 180 and the electrical connectors 182 may be performed while the encapsulant 172 is on a tape. The electrical connectors 182 and the dies 160A, 160B are disposed at opposite sides of the interposer 104. In some embodiments, after forming the electrical connectors 182, a semiconductor structure 100 is formed. In some embodiments, the semiconductor structure 100 is a semiconductor package. In some embodiments, the semiconductor structure 100 is an integrated fan out (InFO) package, where I/O terminals of the die 160A or the die 160B are fanned out and redistributed over a surface of the die 160A or the die 160B in a greater area. In some embodiments, the semiconductor structure 100 is a chip-on-wafer-on-substrate (CoWoS) packaging device. In some embodiments, the semiconductor structure 100 is a three-dimensional integrated circuit (3D IC). In some embodiments, the semiconductor structure 100 is configured to perform an ultra-high speed signal transmission at a high frequency, e.g., a signal transmission at a frequency substantially greater than about 10 (GHz) within the semiconductor structure 100.

The electrical connectors 182 may be configured to provide power and/or signal to the dies 160A, 160B from other computing device (not shown). For example, as shown in FIG. 1G, one of the electrical connectors 182 is electrically connected to the die 160B through the interposer 104, the RDL structure 110 and the electrical connector 152. Similarly, although not shown in FIG. 1G, the electrical connectors 182 may be electrically connected to the die 160A through the interposer 104, the RDL structure 110 and the electrical connector 152. In addition, one of the electrical connectors 182 may be electrically connected to the ground plane 130.

The die 160A may provide RF signal to the antenna pad 120. For example, as shown in FIG. 1G, the die 160A provides the RF signal to the antenna pad 120 through the electrical connector 152, the conductive pattern 150, the conductive pattern 144, the conductive via 142, the conductive line 116c, the conductive via 114c, the conductive pattern 124 and the conductive pattern 122 sequentially. In some embodiments, as shown in FIG. 1G, an RF signal 190 is emitted from the antenna pad 120 through the antenna cavity 135 and is upward transmitted by passing through the slits 134 of the ground plane 130. The RF signal 190 may be a signal at a frequency substantially greater than about 10 GHz. For example, the RF signal 190 is a signal at a frequency substantially greater than about 100 GHz. In some embodiments, the antenna pad 120, the conductive patterns 122, 124 and the ground plane 130 are embedded in the RDL structure 110. Accordingly, the antenna cavity 135 surrounded by the sidewalls of the conductive patterns 122, 124 is also embedded in the RDL structure 110. In other words, the semiconductor structure 100 may be a semiconductor package with an embedded antenna cavity for RF upward transceiving. Thus, the semiconductor structure 100 with the antenna cavity 135 may have a reduced size. In some embodiments, the antenna pad 120, the conductive patterns 122, 124 and the ground plane 130 are formed simultaneously with the RDL structure 110, and thus the cost and/or time of manufacturing the semiconductor structure 100 is not increased largely. In addition, a thickness of the interposer 104 may be adjusted based on the requirements.

Figure 3A:
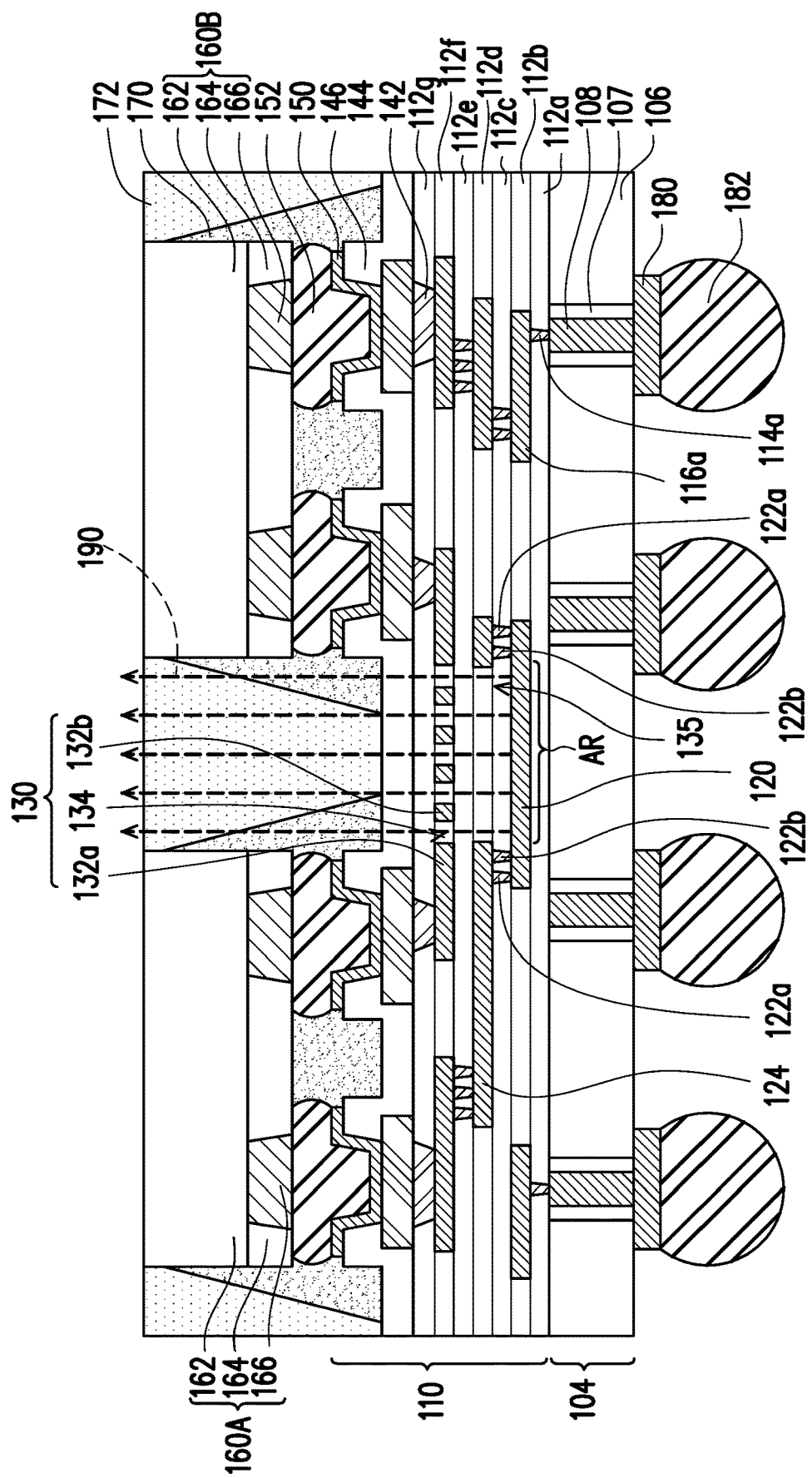
FIG. 3A illustrates a schematic cross-sectional view of a semiconductor structure in accordance with some embodiments of the disclosure.
Figure 3B:
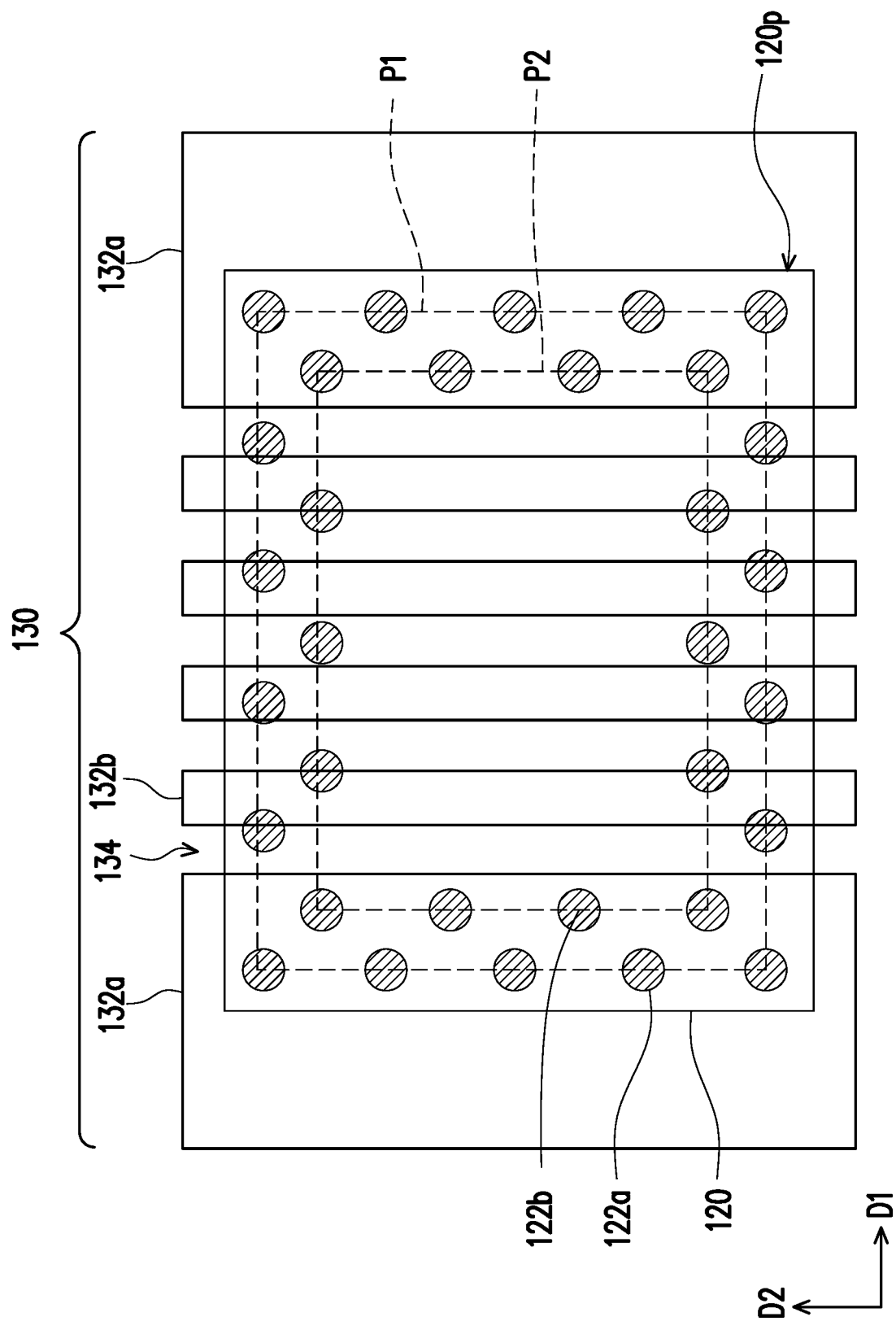
FIG. 3B illustrates a schematic top view of a semiconductor structure of FIG. 3A in accordance with some embodiments of the disclosure.
Figure 4:
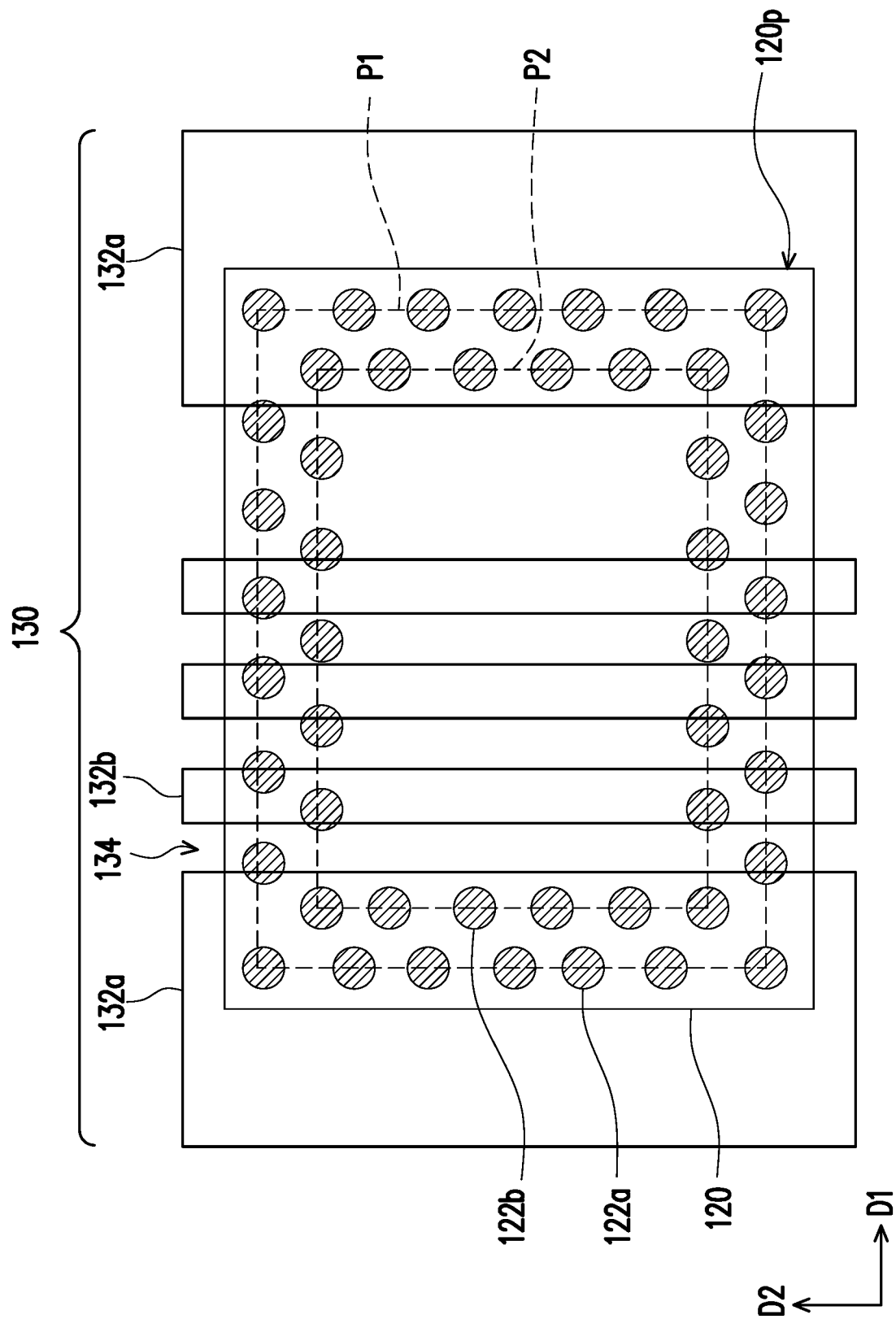
FIG. 4 illustrate schematic a top view of a semiconductor structure in accordance with some embodiments of the disclosure.

In some embodiments, the conductive patterns 122 aside the antenna cavity 135 are illustrated as a plurality of discrete through vias arranged along one ring-shaped path P, however, the disclosure is not limited thereto. In other words, the conductive patterns 122 may be arranged along a plurality of ring-shaped paths. In some embodiments, as shown in FIGS. 3A and 3B, the conductive patterns 122a, 122b include a plurality of through vias arranged along a plurality of ring-shaped paths P1, P2. In some embodiments, a first group of discrete conductive patterns 122a is arranged along the first ring-shaped path P1, a second group of discrete conductive patterns 122b is arranged along the second ring-shaped path P2 surrounded by the first ring-shaped path P1, and the ring-shaped paths P1, P2 respectively surround the area AR. In some embodiments, the first ring-shaped path P1 is disposed between the second ring-shaped path P2 and the periphery 120p of the antenna pad 120. In some embodiments, the second group of the conductive patterns 122b is disposed between the first group of the conductive patterns 122a and the area AR. In some embodiments, a diameter (e.g., width) of the conductive patterns 122a is the same as or different from a diameter (e.g., width) of the conductive patterns 122b. In some embodiments, in a direction (such as the first direction D1 or the second direction D2) perpendicular to the stacking direction, one of the conductive patterns 122a of the first group is not overlapped with one of the conductive patterns 122b of the second group. Thus, the conductive patterns 122a and the conductive patterns 122b may be arranged closely. In such embodiments, compared to merely disposing the conductive patterns 122a or the conductive patterns 122b, the conductive patterns 122a and the conductive patterns 122b cooperatively form a surrounding sidewall for the antenna cavity 135. In some embodiments, as shown in FIG. 4, in the direction (such as the first direction D1 or the second direction D2) perpendicular to the stacking direction, the conductive pattern 122a and the conductive pattern 122b are partially overlapped with each other. In alternative embodiments (not shown), in the direction (such as the first direction D1 or the second direction D2) perpendicular to the stacking direction, the conductive pattern 122a and the conductive pattern 122b are fully overlapped with each other. In such embodiments, the conductive pattern 122a and the conductive pattern 122b are aligned with each other.

Figure 5:
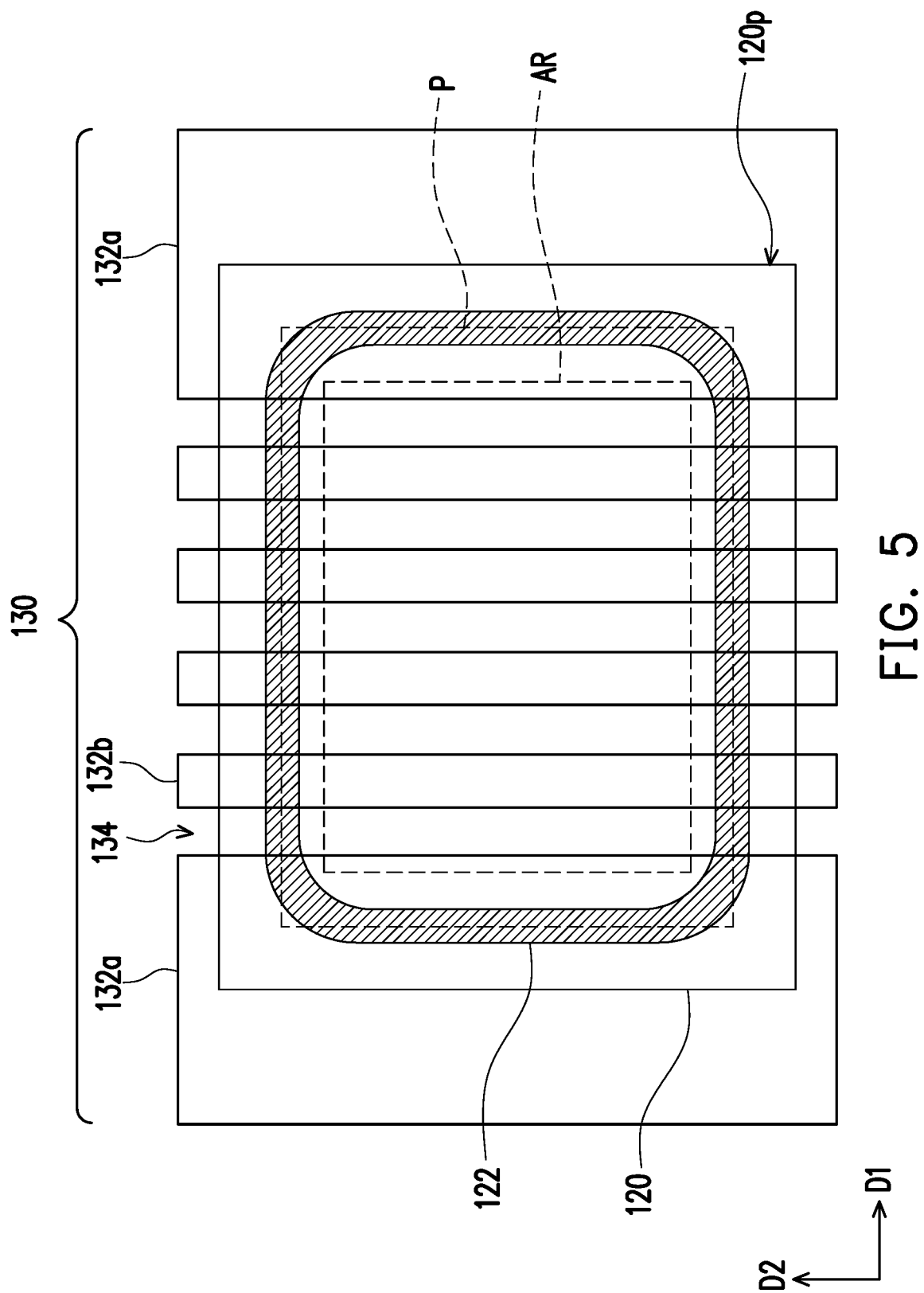
FIG. 5 illustrate schematic a top view of a semiconductor structure in accordance with some embodiments of the disclosure.
Figure 6:
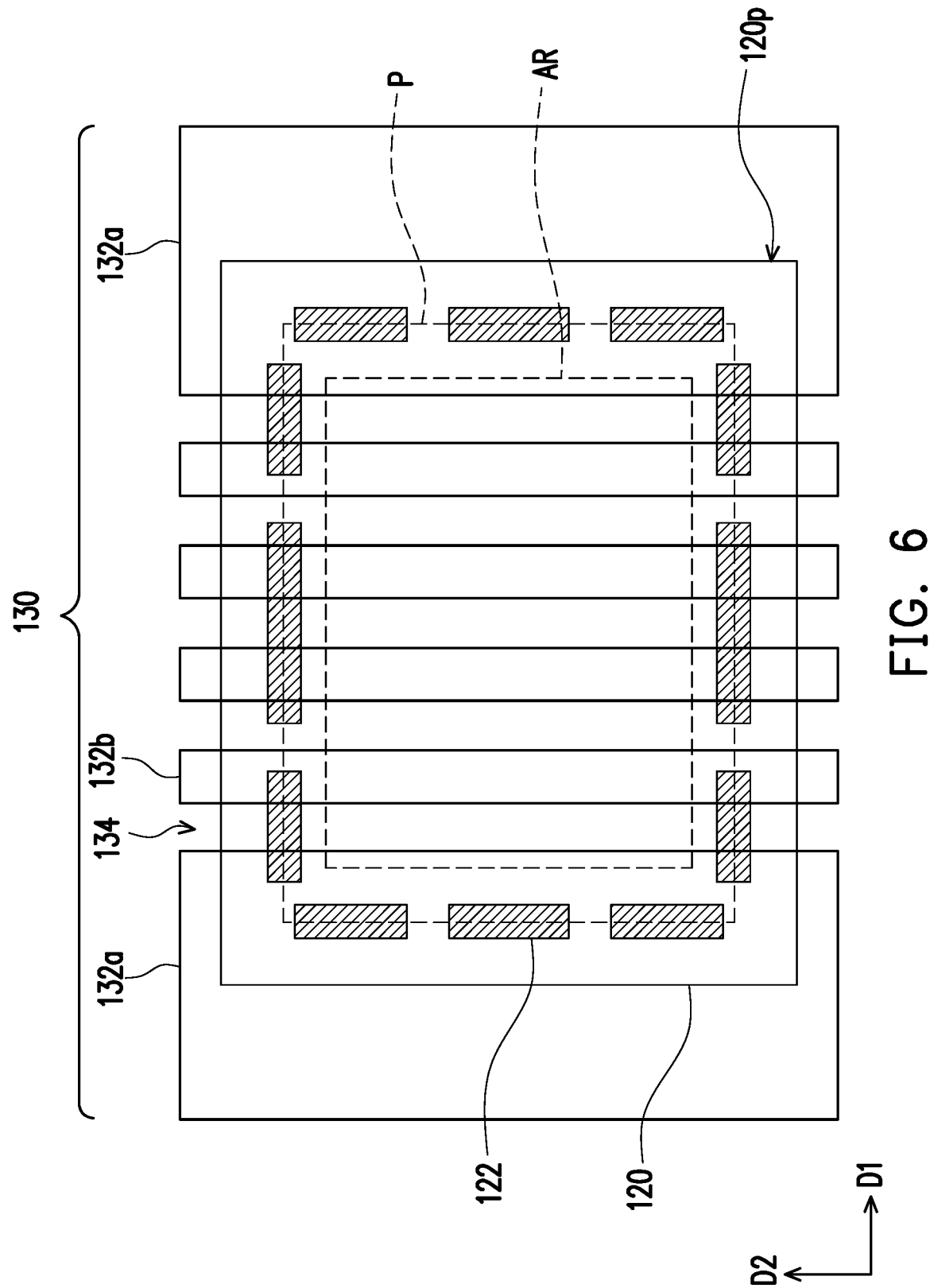
FIG. 6 illustrate schematic a top view of a semiconductor structure in accordance with some embodiments of the disclosure.
Figure 7:
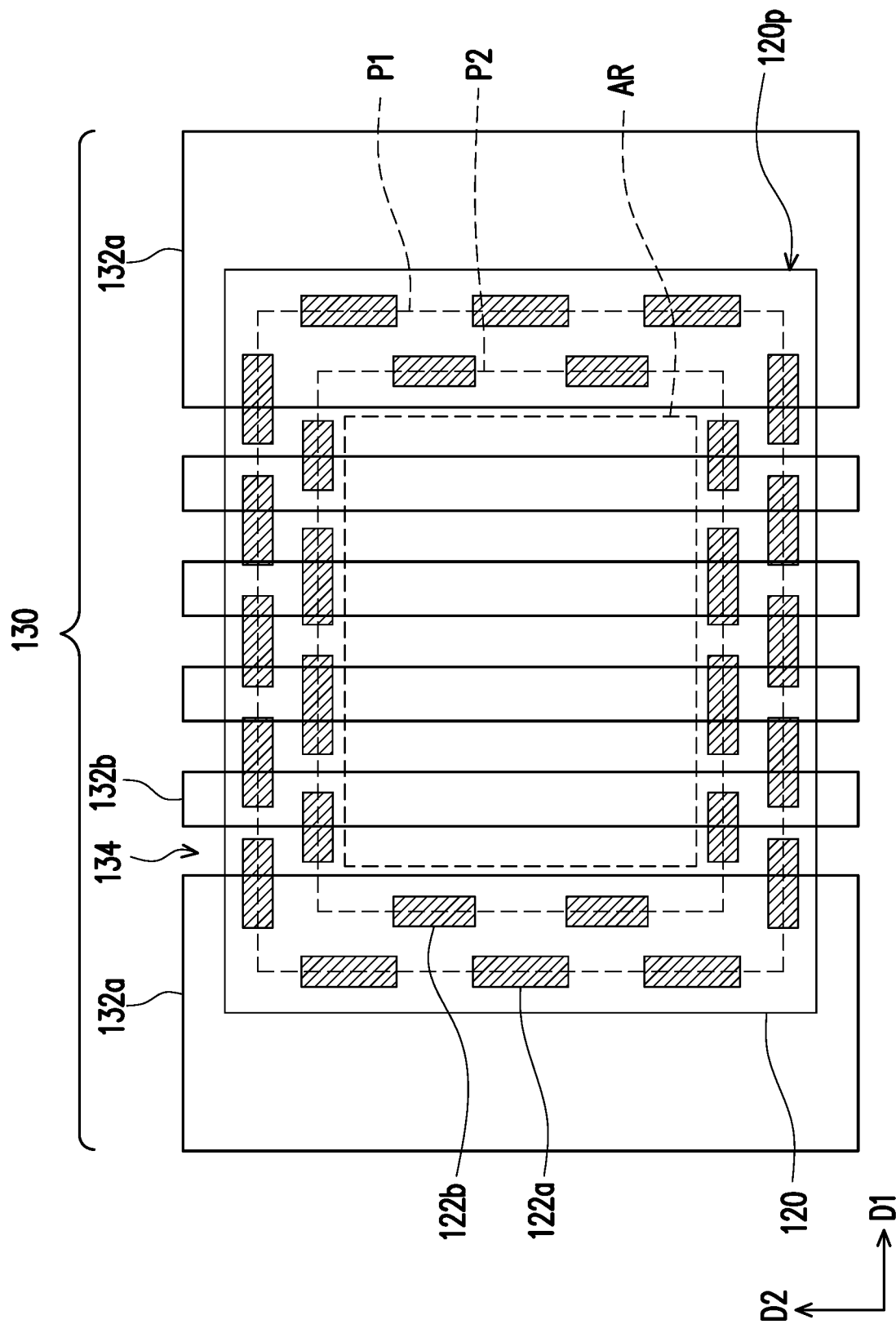
FIG. 7 illustrate schematic a top view of a semiconductor structure in accordance with some embodiments of the disclosure.
Figure 8:
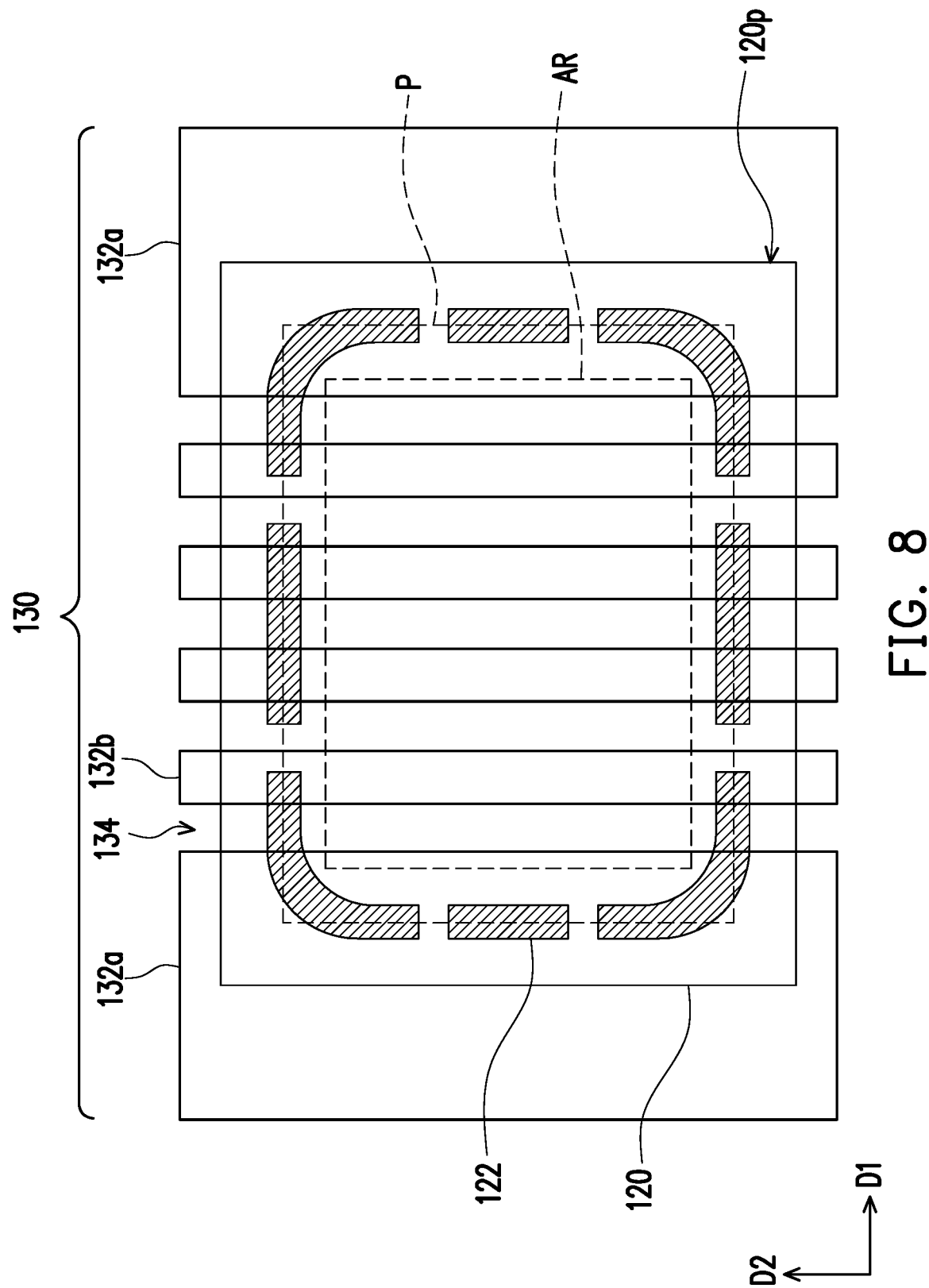
FIG. 8 illustrate schematic a top view of a semiconductor structure in accordance with some embodiments of the disclosure.

The conductive pattern 122 may have other configurations. For example, as shown in FIG. 5, the conductive pattern 122 is a ring-shaped structure surrounding the area AR. The conductive pattern 122 is continuously formed along a ring-shaped path P. In some embodiments, the conductive pattern 122 has a uniform dimension (i.e., width). However, the disclosure is not limited thereto. In alternative embodiments, the conductive pattern 122 has different dimension (i.e., width). In some embodiments, the dimension (i.e., width) of the conductive pattern 122 ranges from about 0.1 µm to about 100 µm. In alternative embodiments, as shown in FIG. 6 and FIG. 7, the conductive patterns 122 are a plurality of discrete wall-shaped structures. In some embodiments, as shown in FIG. 6, the conductive patterns 122 (i.e., the wall-shaped structures) are separated from each other and arranged along one ring-shaped path P. In some embodiments, as shown in FIG. 7, a first group of discrete conductive patterns 122a (i.e., the wall-shaped structures) is arranged along the first ring-shaped path P1, a second group of discrete conductive patterns 122b (i.e., the wall-shaped structures) is arranged along the second ring-shaped path P2 surrounded by the first ring-shaped path P1, and the ring-shaped paths P1, P2 respectively surround the area AR. Thus, the conductive patterns 122a and the conductive patterns 122b may be arranged closely. In such embodiments, compared to merely disposing the conductive patterns 122a or the conductive patterns 122b, the conductive patterns 122a and the conductive patterns 122b cooperatively form a more effective sidewall for the antenna cavity 135. In some embodiments, the conductive patterns 122, 122a, 122b are respectively disposed at one side of the antenna pad 120. However, the disclosure is not limited thereto. In some embodiments, as shown in FIG. 8, at least one of the conductive patterns 122 is continuously disposed at two adjacent sides of the antenna pad 120. In alternative embodiments, at least one of the conductive patterns 122 is continuously disposed at three or four adjacent sides of the antenna pad 120.

Figure 9A:
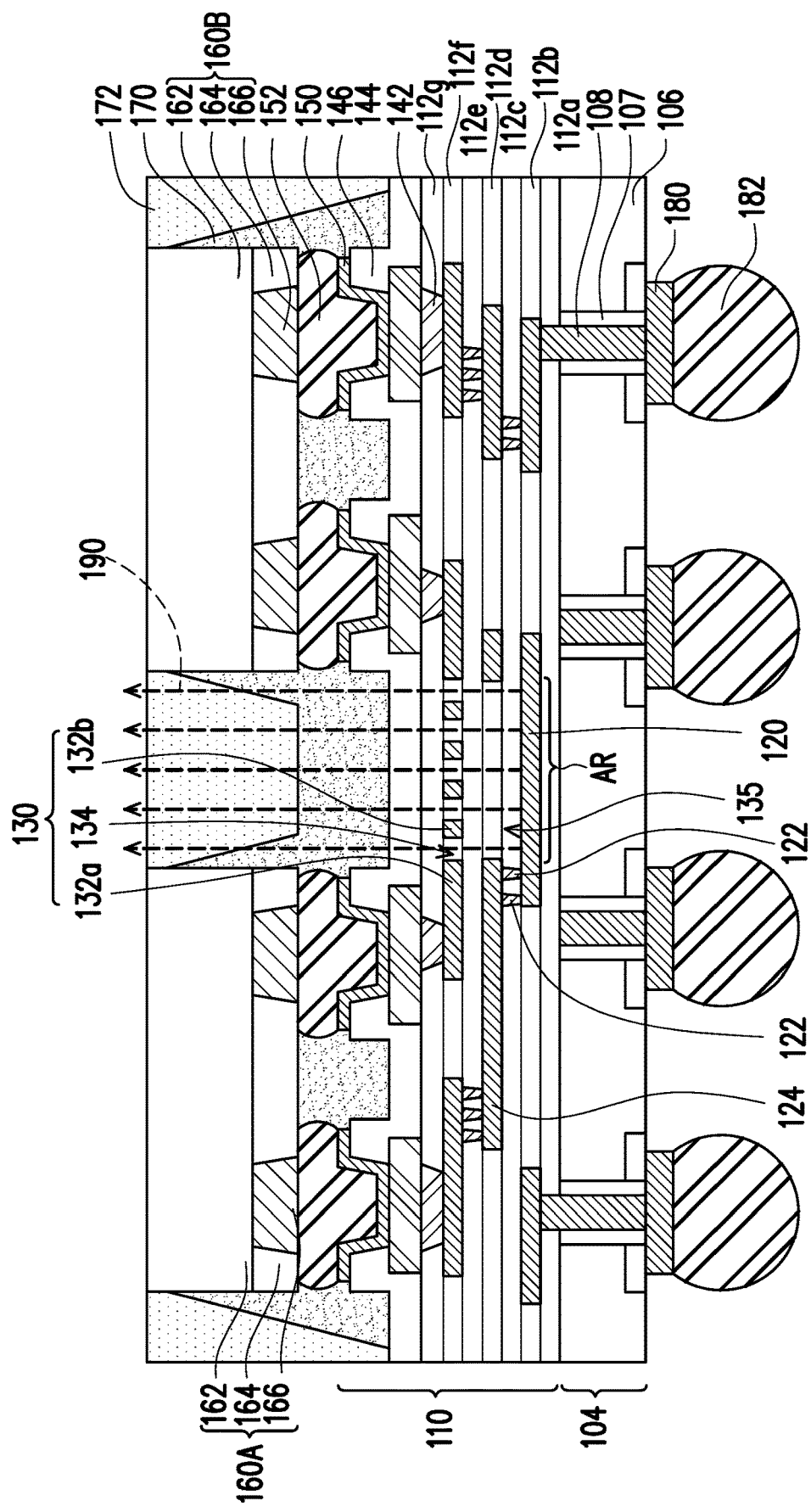
FIG. 9A illustrates a schematic cross-sectional view of a semiconductor structure in accordance with some embodiments of the disclosure.
Figure 9B:
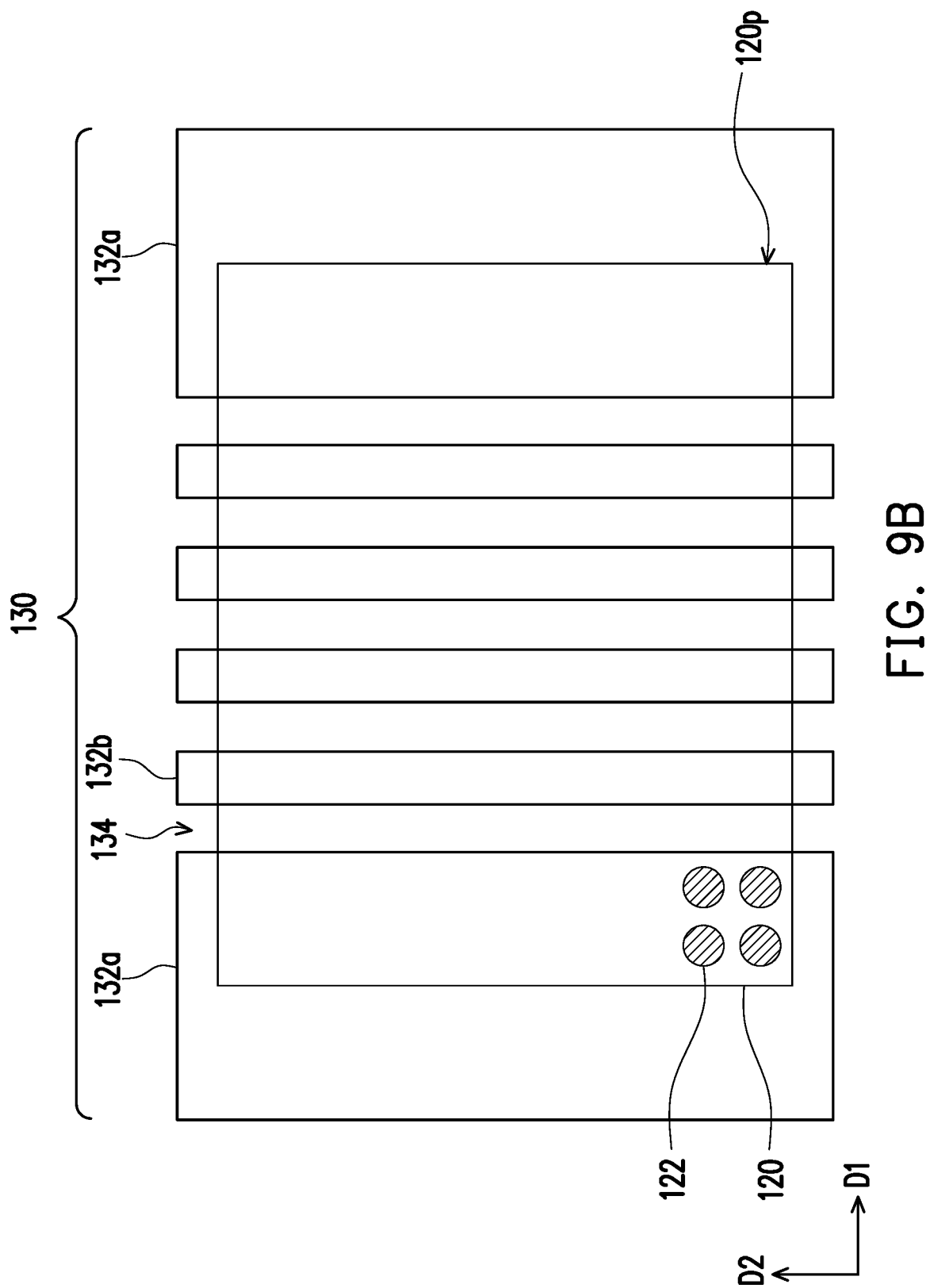
FIG. 9B illustrates a schematic top view of a semiconductor structure of FIG. 9A in accordance with some embodiments of the disclosure.

In some embodiments, as shown in FIGS. 9A and 9B, the conductive patterns 122 are only formed for electrical connection between the antenna pad 120 and the conductive pattern 124. In other words, the conductive patterns 122 may be not arranged to surround an area AR of the antenna pad 120. In such embodiments, a vertical distance between the antenna pad 120 and the conductive pattern 124 is relatively small, and thus the antenna cavity 135 is formed by the antenna pad 120, the ground plane 130 and the inner sidewalls of the conductive patterns 124. The conductive patterns 122 may have other configurations and/or arrangement.

Figure 10:
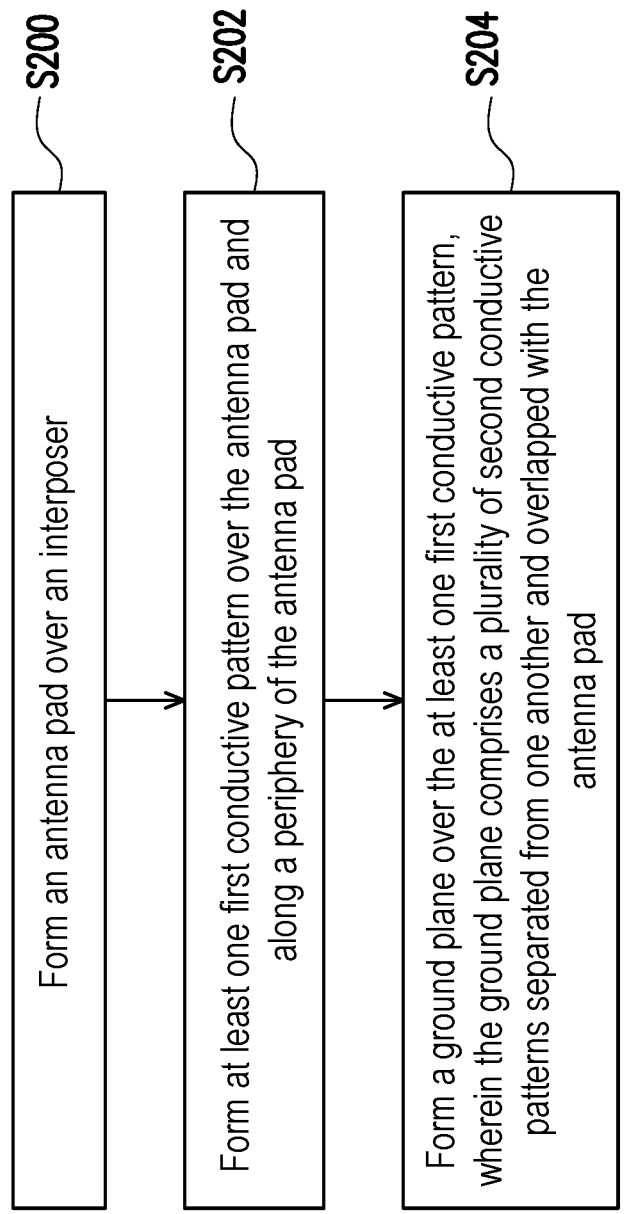
FIG. 10 illustrates a flow chart of a method of forming a semiconductor package in accordance with some embodiments of the disclosure.

FIG. 10 illustrates a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, an antenna pad is formed over an interposer. FIG. 1B and FIG. 3A illustrate varying views corresponding to some embodiments of act S200.

At act S202, at least one first conductive pattern is formed over the antenna pad and along a periphery of the antenna pad. FIG. 1C, FIG. 2, FIG. 3A, FIG. 3B, FIG. 4, FIG. 5, FIG. 6, FIG. 7 and FIG. 8 illustrate varying views corresponding to some embodiments of act S202.

At act S204, a ground plane is formed over the at least one first conductive pattern, wherein the ground plane includes a plurality of second conductive patterns separated from one another and overlapped with the antenna pad. FIG. 1D, FIG. 2, FIG. 3A, FIG. 3B, FIG. 4, FIG. 5, FIG. 6, FIG. 7 and FIG. 8 illustrate varying views corresponding to some embodiments of act S204.

In accordance with some embodiments of the disclosure, a semiconductor structure includes an antenna pad, a ground plane and a plurality of conductive vias. The ground plane is disposed over the antenna pad and includes a plurality of first conductive patterns separated from one another. The conductive vias are disposed between the antenna pad and the ground plane. The plurality of conductive vias are arranged to surround an area of the antenna pad and electrically connected to the antenna pad, and the plurality of first conductive patterns are overlapped with the area of the antenna pad.

In accordance with some embodiments of the disclosure, a semiconductor structure includes an interposer, an antenna pad, at least one first conductive pattern, at least one second conductive pattern, a ground plane and at least one die. The antenna pad is disposed over the interposer. The at least one first conductive pattern is disposed along a periphery of the antenna pad. The at least one second conductive pattern is disposed over the at least one first conductive pattern. The ground plane is disposed over the at least one second conductive pattern, and includes a plurality of third conductive patterns separated from one another and overlapped with the antenna pad. The at least one die is disposed over the ground plane and electrically connected to the antenna pad.

In accordance with some embodiments of the disclosure, a method of forming a semiconductor structure includes the following steps. An antenna pad is formed over an interposer. At least one first conductive pattern is formed over the antenna pad and along a periphery of the antenna pad. A ground plane is formed over the at least one first conductive pattern, wherein the ground plane comprises a plurality of second conductive patterns separated from one another and overlapped with the antenna pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an antenna pad over the substrate;
a ground plane over the antenna pad, comprising a plurality of first conductive patterns separated from one another; a plurality of first conductive vias between the antenna pad and the ground plane, wherein the plurality of first conductive vias are arranged to surround an area of the antenna pad and electrically connected to the antenna pad, and the plurality of first conductive patterns are overlapped with the area of the antenna pad; and
a second conductive via, wherein the second conductive via is disposed outside the plurality of first conductive vias and the area of the antenna pad, and a projection of the second conductive via onto the substrate is separated from a projection of the antenna pad onto the substrate and a projection of the ground plane onto the substrate.

2. The semiconductor structure according to claim 1 further comprising a dielectric material filling an antenna cavity defined by the area of the antenna pad, the ground plane and inner sidewalls of the plurality of first conductive vias.

3. The semiconductor structure according to claim 1, wherein the plurality of first conductive vias are arranged along a first ring-shaped path and arranged along a second ring-shaped path, and the first ring-shaped path is between the second ring-shaped path and a periphery of the antenna pad.

4. The semiconductor structure according to claim 1 further comprising a plurality of dielectric patterns between the plurality of first conductive patterns of the ground plane.

5. The semiconductor structure according to claim 1, wherein the plurality of first conductive vias are in direct contact with the antenna pad.

6. The semiconductor structure according to claim 1 further comprising a second conductive pattern between the plurality of first conductive vias and the plurality of first conductive patterns, wherein the second conductive pattern covers and electrically connects portions of the plurality of first conductive vias.

7. The semiconductor structure according to claim 1, wherein the second conductive via and the plurality of first conductive vias are disposed in a dielectric layer, and the second conductive via is electrically connected to a conductive line physically separated from the antenna pad.

8. A semiconductor structure, comprising:
an antenna pad;
at least one first conductive pattern disposed along a periphery of the antenna pad;
at least one second conductive pattern over the at least one first conductive pattern;
a ground plane over the at least one second conductive pattern, comprising a plurality of third conductive patterns separated from one another and overlapped with the antenna pad; at least one die, disposed over the ground plane and electrically connected to the antenna pad; and
a redistribution layer structure, comprising
a first conductive line and a first dielectric layer aside the first conductive line and the antenna pad;
a first conductive via and a second dielectric layer aside the first conductive via and the at least one first conductive pattern;
a second conductive line and a third dielectric layer aside the second conductive line and the at least one second conductive pattern; and
a third conductive line and a fourth dielectric layer aside the third conductive line and the plurality of third conductive patterns.

9. The semiconductor structure according to claim 8, wherein the at least one first conductive pattern comprises a plurality of conductive vias.

10. The semiconductor structure according to claim 8, wherein the at least one first conductive pattern comprises a plurality of wall-shaped structures.

11. The semiconductor structure according to claim 8, wherein the at least one first conductive pattern comprises a wall-shaped structure continuously disposed along the periphery of the antenna pad.

12. The semiconductor structure according to claim 8 further comprising a dielectric material filled in an antenna cavity among the antenna pad, the ground plane and sidewalls of the at least one first conductive pattern and the at least one second conductive pattern.

13. The semiconductor structure according to claim 8, wherein a top surface of the antenna pad is substantially coplanar with a top surface of the first conductive line, and a bottom surface of the antenna pad is substantially coplanar with a bottom surface of the first conductive line.

14. The semiconductor structure according to claim 8, wherein the at least one die is electrically connected to the antenna pad through the at least one first conductive pattern and the at least one second conductive pattern.

15. The semiconductor structure according to claim 8, wherein an inner sidewall of the outermost third conductive pattern is substantially flush with an inner sidewall of the at least one second conductive pattern.

16. The semiconductor structure according to claim 8 further comprising a plurality of electrical connectors, wherein the plurality of electrical connectors and the at least one die are disposed at opposite sides of an interposer.

17. A semiconductor structure, comprising:
an interposer;
an antenna pad over the interposer;
at least one first conductive pattern disposed over the antenna pad;
a ground plane disposed over the at least one first conductive pattern;
at least one die, disposed over the ground plane and electrically connected to the antenna pad; and
a plurality of electrical connectors, wherein the plurality of electrical connectors and the at least one die are disposed at opposite sides of the interposer, and the antenna pad, the at least one first conductive pattern and the ground plane are overlapped.

18. The semiconductor structure according to claim 17, wherein the at least one first conductive pattern comprises a plurality of conductive vias disposed along a periphery of the antenna pad.

19. The semiconductor structure according to claim 17, further comprising a third conductive pattern covering portions of the at least one first conductive pattern.

20. The semiconductor structure according to claim 17, wherein the at least one die comprises a first die and a second die, and the antenna pad, the at least one first conductive pattern and the ground plane are disposed between the first die and the second die.

* * * * *